United States Patent [19]
Schaffer

[11] Patent Number: 5,498,984
[45] Date of Patent: Mar. 12, 1996

[54] HIGH SIDE, CURRENT SENSE AMPLIFIER USING A SYMMETRIC AMPLIFIER

[75] Inventor: Gregory L. Schaffer, Cupertino, Calif.

[73] Assignee: Maxim Integrated Products, Sunnyvale, Calif.

[21] Appl. No.: 316,125

[22] Filed: Sep. 30, 1994

[51] Int. Cl.⁶ .................................................. H03K 19/20
[52] U.S. Cl. ................................. 327/51; 327/28; 327/63
[58] Field of Search ................................. 327/28, 51, 63

[56] References Cited

U.S. PATENT DOCUMENTS 5,432,731  7/1995  Kirsch et al. ............................. 327/51

*Primary Examiner*—Margaret Rose Wambach
*Attorney, Agent, or Firm*—Blakely, Sokoloff, Taylor & Zafman

[57] ABSTRACT

A self-contained, bi-polar high-side current sense amplifier which detects the magnitude and polarity of current flowing from one device to another, is disclosed. The amplifier has a symmetric architecture having two inputs and two outputs. One output is active for positive input signals corresponding to current flow in one direction, and the other output is active for negative input signals corresponding to current flow in an opposite direction. A symmetric current mirror in the amplifier provides the OR'ing function required to provide only one output at a time. The amplifier also utilizes aluminum sense and gain resistors, which allows cancellation of resistor temperature coefficients.

29 Claims, 8 Drawing Sheets

HIGH SIDE, CURRENT SENSE AMPLIFIER USING A SYMMETRIC AMPLIFIER

BACKGROUND OF THE INVENTION

1. Field of the Invention

The present invention relates to the field of current sense amplifiers used for measuring current.

2. Background of the Related Art

Current sense amplifiers are typically used to measure the amount of current supplied by and to a power supply in various types of electronic equipment. Several conventional approaches to the implementation of current sense amplifiers exist. These include a single polarity low side current sense amplifier, a low side current sense amplifier with bipolar sensing and a high side switching current sense amplifier.

FIG. 1 depicts a schematic diagram of a conventional single polarity low side current sense amplifier. In this conventional approach, the current sense amplifier 10 comprises a sense resistor ($R_{SENSE}$), two gain resistors ($R_1$ and $R_2$), and an operational amplifier (Op Amp). The operational amplifier has an input common mode operating range that includes its negative input terminal. The output signal provided by the operational amplifier is a voltage that may be expressed as follows:

$$V_{OUT} = ILOAD * R_{SENSE} * R_2/R_1.$$

The current sense amplifier 10, however, can only measure current flowing in one direction, since current flowing in the opposite direction pulls one input of the operational amplifier below the negative input terminal. To obtain a bipolar output signal, an offset reference voltage Vref may be added to the operational amplifier, as illustrated in FIG. 2. However, this design adds a reference-dependent offset to the amplifier output.

A different approach is required for high side switching. If the operational amplifier in FIG. 1 is inverted, its output signal will be referenced to the high or the positive side of the battery. This is rarely desired, since conventionally $V_{OUT}$ is referenced to ground. FIG. 3 shows a high side circuit that can measure the voltage drop across $R_{SENSE}$ for current flow in either direction. If R2 was grounded, current flow could only be measured in one direction, as flow in the reverse direction would require an amplifier output below the negative input terminal. With R2 connected to $V_{REF}$, the output voltage becomes $$V_{OUT} = V_{REF} + ILOAD * R_{SENSE} * R_2/R_1 \text{ where } R_4/R_3 = R_2/R_1.$$

A disadvantage of this circuit is that it requires close matching of the foregoing resistance ratios of resistors $R_1$ through $R_4$ in order to suppress common mode signals.

Accordingly, there is a need in the technology to provide a current sense amplifier that can measure the magnitude and polarity of current flow, without the need to accommodate an offset output signal nor the need to monitor a plurality of gain resistors.

BRIEF SUMMARY OF THE INVENTION

A self-contained, bi-polar high-side current sense amplifier for detecting the magnitude and polarity of current flowing from one device to another, is disclosed. The amplifier has a symmetric architecture having two inputs and two outputs. One output is active for positive input signals corresponding to current flow in one direction, and the other output is active for negative input signals corresponding to current flow in an opposite direction. A symmetric current mirror in the amplifier provides the OR'ing function required to provide only one output at a time. The amplifier also utilizes aluminum sense and gain resistors, which allows cancellation of resistor temperature coefficients.

BRIEF DESCRIPTION OF THE DRAWINGS

These and other features of the invention will now be described with reference to the drawings of a preferred embodiment which is intended to illustrate and not to limit the invention, and in which.

DETAILED DESCRIPTION OF THE INVENTION

The present invention is a self-contained, high-side current sense amplifier for detecting the magnitude and polarity of current flowing from one device to another through an internal or an external sense resistor. The amplifier has a symmetric architecture having two inputs and two outputs. One output is active for positive input signals, and the other output is active for negative input signals. A symmetric current mirror in the amplifier provides the OR'ing function required to provide only one output at a time. The amplifier also utilizes aluminum sense and gain resistors, which allows cancellation of resistor temperature coefficients.

The current sense amplifier of the present invention generates an output in the form of a current, which provides more versatility than a fixed gain output voltage signal. The amplifier also provides much better accuracy at low currents than conventional approaches using reference voltages for offsetting the zero point.

Figure 1:
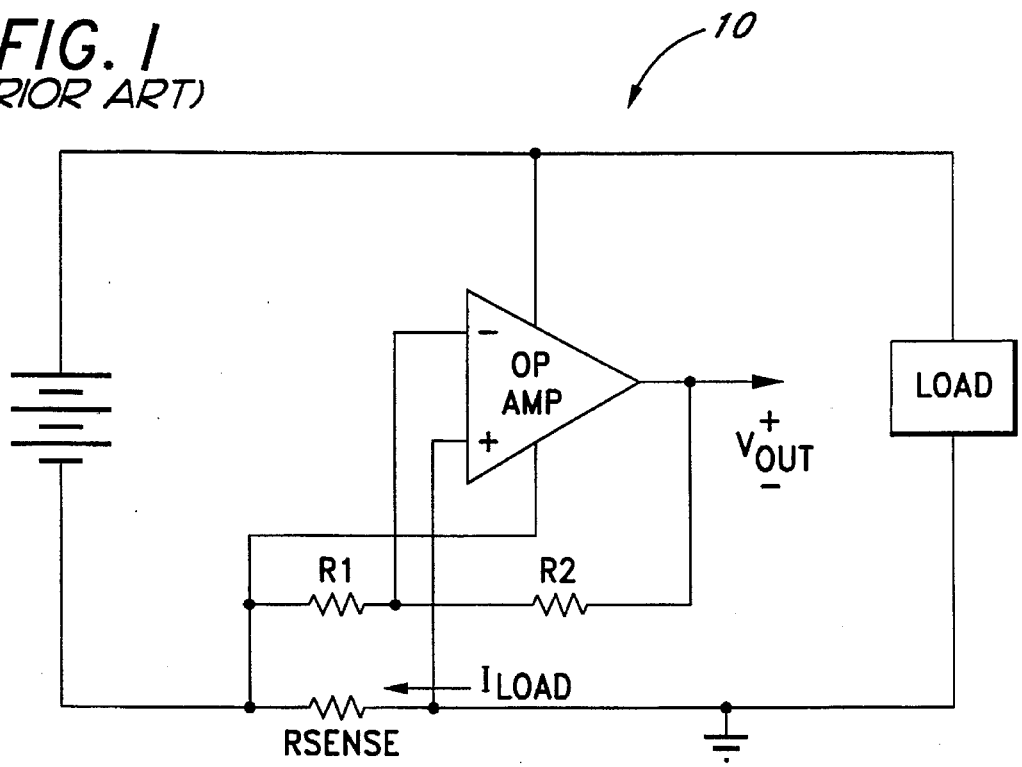
FIG. 1 depicts a diagram of a conventional single polarity low side current sense amplifier.
Figure 2:
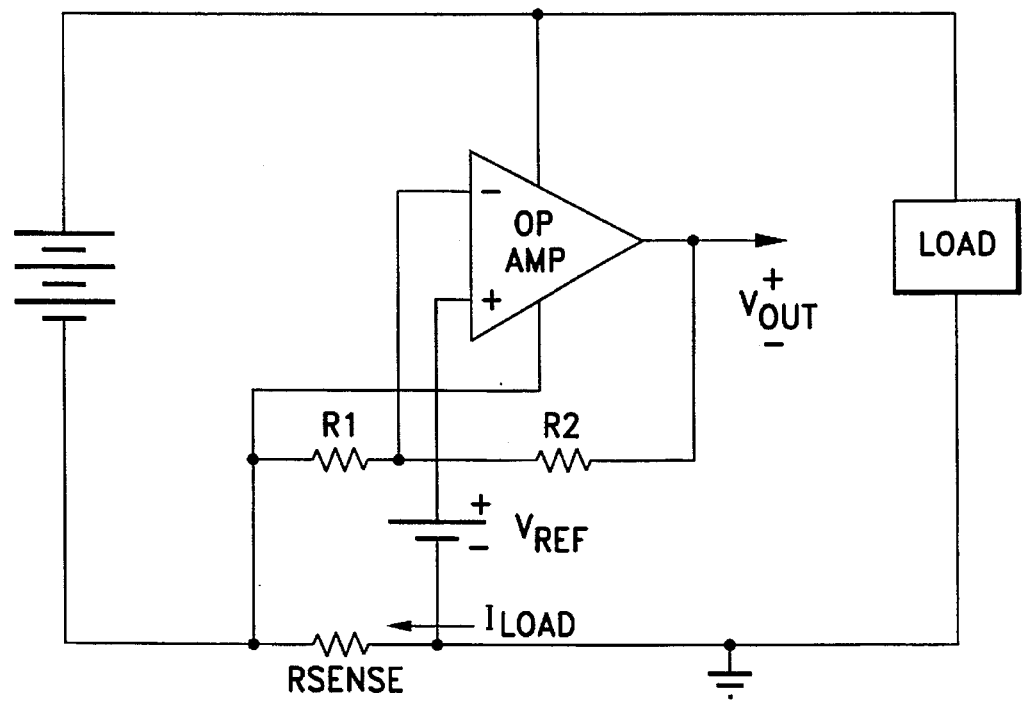
FIG. 2 depicts a schematic diagram of a conventional bipolar low side current sense amplifier.
Figure 3:
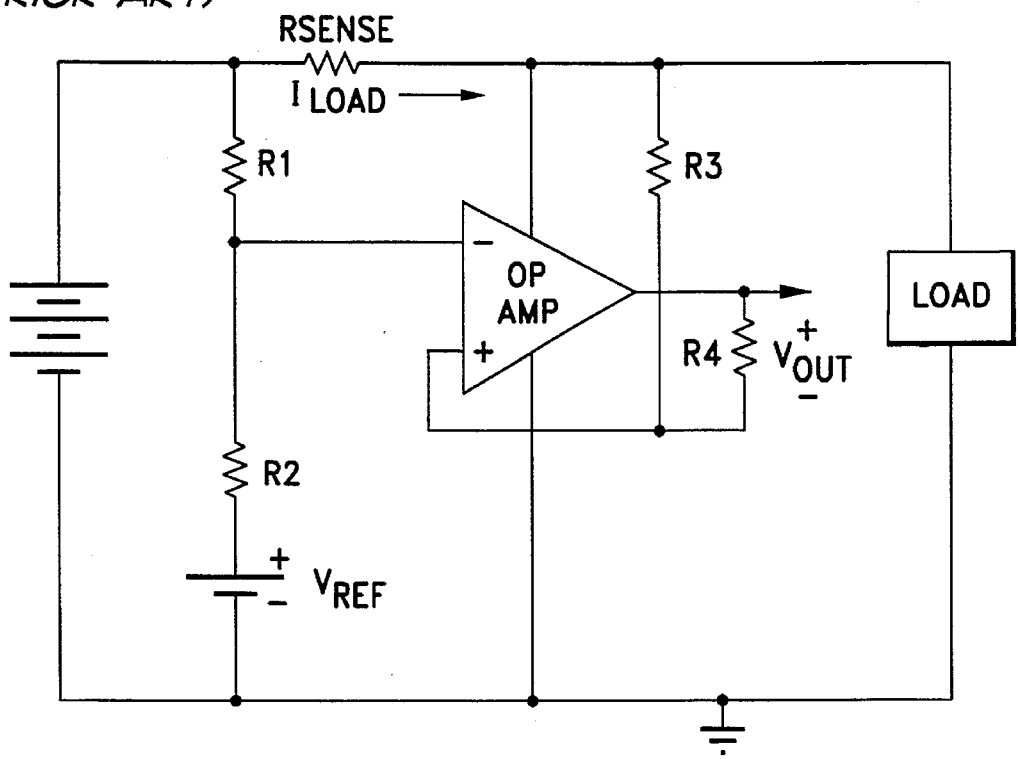
FIG. 3 depicts a schematic diagram of a conventional bipolar high side current sense amplifier.
Figure 4:
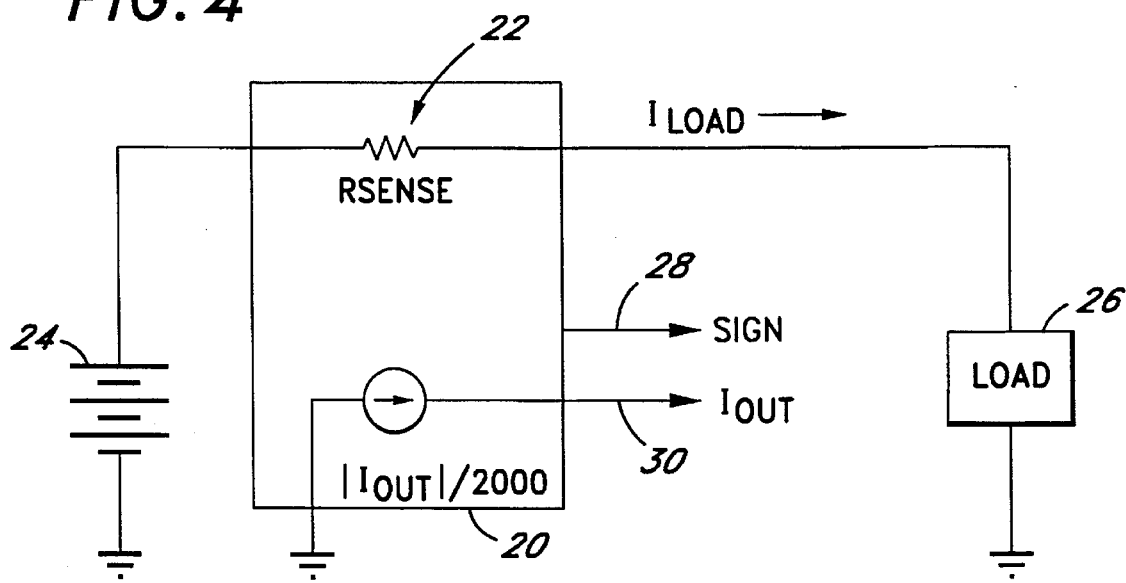
FIG. 4 depicts a top level functional block diagram of one embodiment of the symmetric bipolar current sense amplifier of the present invention.

FIG. 4 illustrates a functional block diagram of one embodiment of the symmetric bipolar current sense amplifier of the present invention. The symmetric bipolar current sense amplifier 20 comprises an internal resistor $R_{SENSE}$ 22 connected between and in series with the power source 24 and the load 26. In an alternate embodiment, an external resistor may be used. The current sense amplifier 20 detects the magnitude and polarity of the voltage drop across $R_{SENSE}$ 22 and generates two signals, $I_{SIGN}$ and $I_{OUT}$ via signal lines 28, 30. The signal $I_{SIGN}$ provided on line 28 is a Boolean signal, the state of which indicates the direction of current flow in the resistor $R_{SENSE}$. In a preferred embodiment, $I_{SIGN}$ will be a logic high when the current sense amplifier 20 detects current flowing from the power source 24 to the load 26. Conversely, $I_{SIGN}$ will be a logic low when the current sense amplifier 20 detects current flowing from the load 26 to the power source 24. The signal $I_{OUT}$ provided on line 30 is a current referenced to the negative input terminal of the current sense amplifier 20 and is proportional to the load current, ILOAD. In a preferred embodiment, using an internal sense resistor $R_{SENSE}$, $I_{OUT} = (|I_{LOAD}|/2000)$ amps. If an external resistor is used instead of the internal resistor $R_{SENSE}$ 22, the ratio $(=I_{OUT}=/I_{LOAD})$ will be dependent on the value of the external resistor or resistors used.

Figure 5:
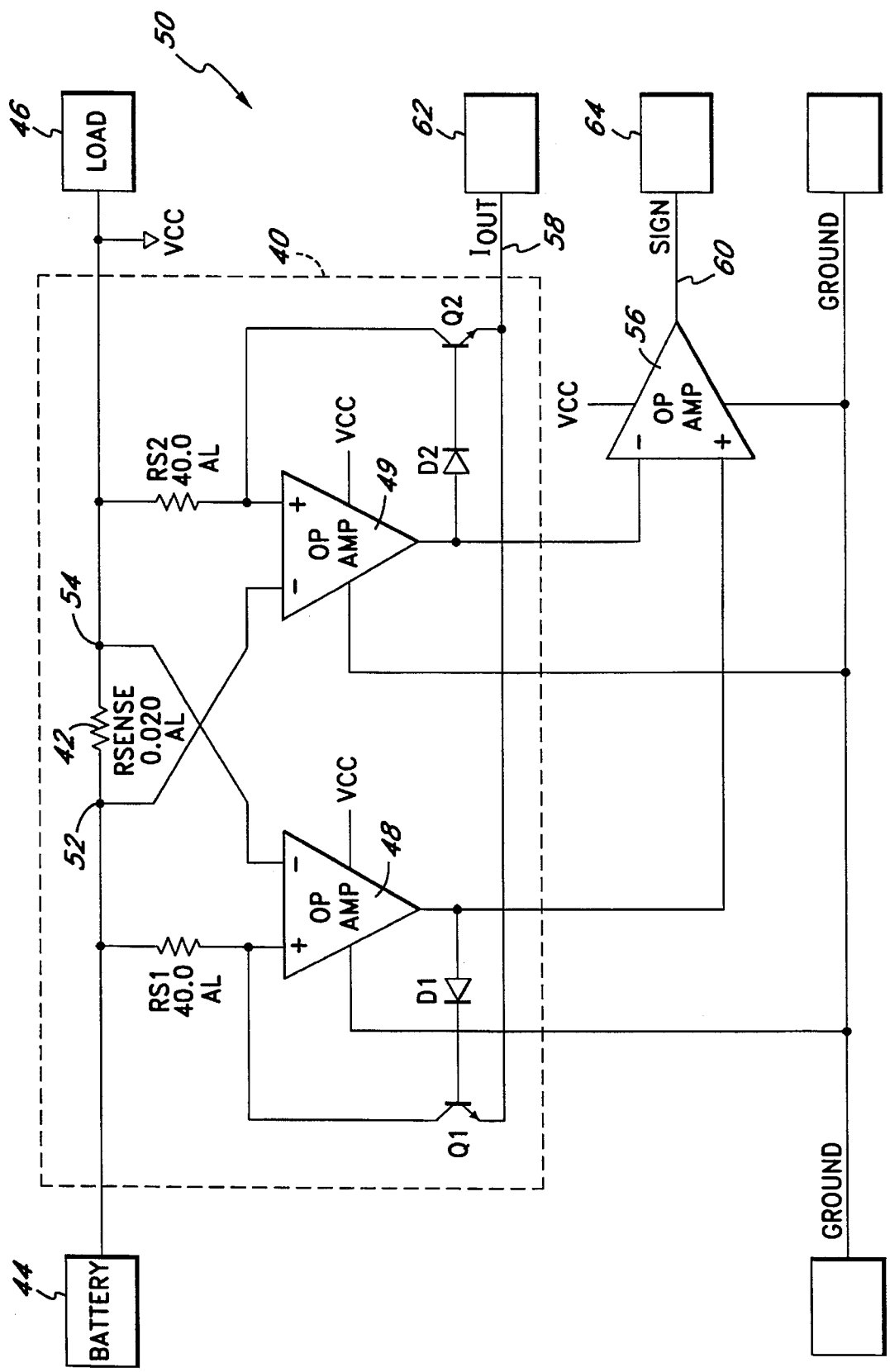
FIG. 5 is a block diagram illustrating one implementation of the symmetric bipolar current sense amplifier of FIG. 4.

FIG. 5 is a block diagram illustrating the implementation of the symmetric bipolar current sense amplifier of FIG. 4 utilizing conventional components. This preferred implementation merges two operational amplifiers and part of a comparator into a single circuit 50, as will be described in detail below. The symmetric current sensing amplifier circuit 50 comprises an internal sense resistor $R_{SENSE}$ 42 connected in series with a power source such as a battery 44 at one end and with a load 46 at the other end. The load 46 has a potential of VCC volts. For discussion purposes, the current $I_{LOAD}$ flowing from battery 44, through $R_{SENSE}$ 42 to load 46 is considered to have a positive polarity. As such, $R_{SENSE}$ 42 is considered to have its positive terminal 52 connected to battery 44 and its negative terminal 54 connected to load 46. The battery 44 and load 46 are both grounded.

The amplifier circuit 50 further comprises a symmetric amplifier 40 having two operational amplifiers 48, 49 which are implemented as mirror images of each other and are symmetric about a longitudinal axis between operational amplifiers 48 and 49. The negative input terminal of operational amplifier 48 is connected to the negative terminal 54 of $R_{SENSE}$ 42. The positive input terminal of operational amplifier 48 is connected between battery 44 and the positive terminal 52 of $R_{SENSE}$ 42 via resistor RS1. The negative input terminal of operational amplifier 49 is connected to the positive terminal 52 of $R_{SENSE}$ 42. The positive input terminal of operational amplifier 49 is connected between load 46 and the negative terminal 54 of $R_{SENSE}$ 42 via resistor RS2. The output of operational amplifier 48 is provided as an input to the positive input terminal of a comparator 56, and the output of operational amplifier 49 is provided as an input to the negative input terminal of comparator 56. The output of operational amplifier 48 is also coupled to the base of transistor Q1 via diode D1. In this manner, a feedback path is established between the output of the operational amplifier 48 and its positive input terminal. The collector of transistor Q1 is coupled to the positive input terminal of operational amplifier 48 and the emitter of transistor Q1, when the transistor is on, provides the signal $I_{OUT}$ via line 58. Similarly, the output of operational amplifier 49 is coupled to the base of transistor Q2 via diode D2. The collector of transistor Q2 is coupled to the positive input terminal of operational amplifier 49, establishing a feedback path between the output of operational amplifier 49 and its positive input terminal. The emitter of transistor Q2, when on, provides the signal $I_{OUT}$ via line 58 to $I_{OUT}$ terminal 62. The comparator 56 generates a signal $I_{SIGN}$ indicative of the polarity of $I_{LOAD}$ via line 60 to $I_{SIGN}$ terminal 64. The operational amplifiers 48, 49 and comparator 56 are each grounded and coupled to the load 46.

In operation, when battery 44 is connected to load 46, $I_{LOAD}$ flows from battery 44 to the load 46 through sense resistor, $R_{SENSE}$ 42. This causes a voltage drop of $I_{LOAD}*R_{SENSE}$ across resistor $R_{SENSE}$ 42. The output of operational amplifier 49 will go to ground since the voltage at its inverting input pin (negative input terminal) is more positive than the voltage at its non-inverting pin (positive input terminal). This reverse biases diode D2, turning off transistor Q2. The output of operational amplifier 48 will go positive (above ground) since the voltage at its noninverting input pin (positive input terminal) is more positive than the voltage at its inverting pin (negative input terminal). This forward biases diode D1 and turns on transistor Q1. Assuming a high input impedance for each operational amplifier, the amplifier circuit 40 reaches equilibrium when the collector current in transistor Q1, which flows through resistor RS1, creates a voltage drop across resistor RS1 equal to that across $R_{SENSE}$ 42. This occurs when the collector current in transistor Q1 equals $I_{LOAD}*R_{SENSE}$/RS1. Where $R_{SENSE}$= 0.020 ohms and RS1=40 ohms, the collector current in transistor Q1 equals $I_{LOAD}$/2000 amps. Most of the collector current in Q1 flows through to its emitter and out the $I_{OUT}$ terminal 62, whereby $I_{OUT}=I_{LOAD}$/2000. The comparator 56 compares the outputs of the two operational amplifiers, 48, 49, so that when current flows from the battery 44 to the load 46, the comparator 56 detects a positive differential input signal, and generates a logic high signal on line 60. This logic high signal indicates that $I_{LOAD}$ has a positive polarity.

If current is flowing from the load 46 into the battery 44, as when the battery is being charged, the operation is identical, with the exception that operational amplifiers 48 and 49 reverse roles, as do diodes D1 and D2, and transistors Q1 and Q2. In this situation, the differential input signal of the comparator 56 will be negative, and the comparator 56 accordingly generates a logic low signal on line 60. This logic low signal indicates that $I_{LOAD}$ has a negative polarity.

Figure 6:
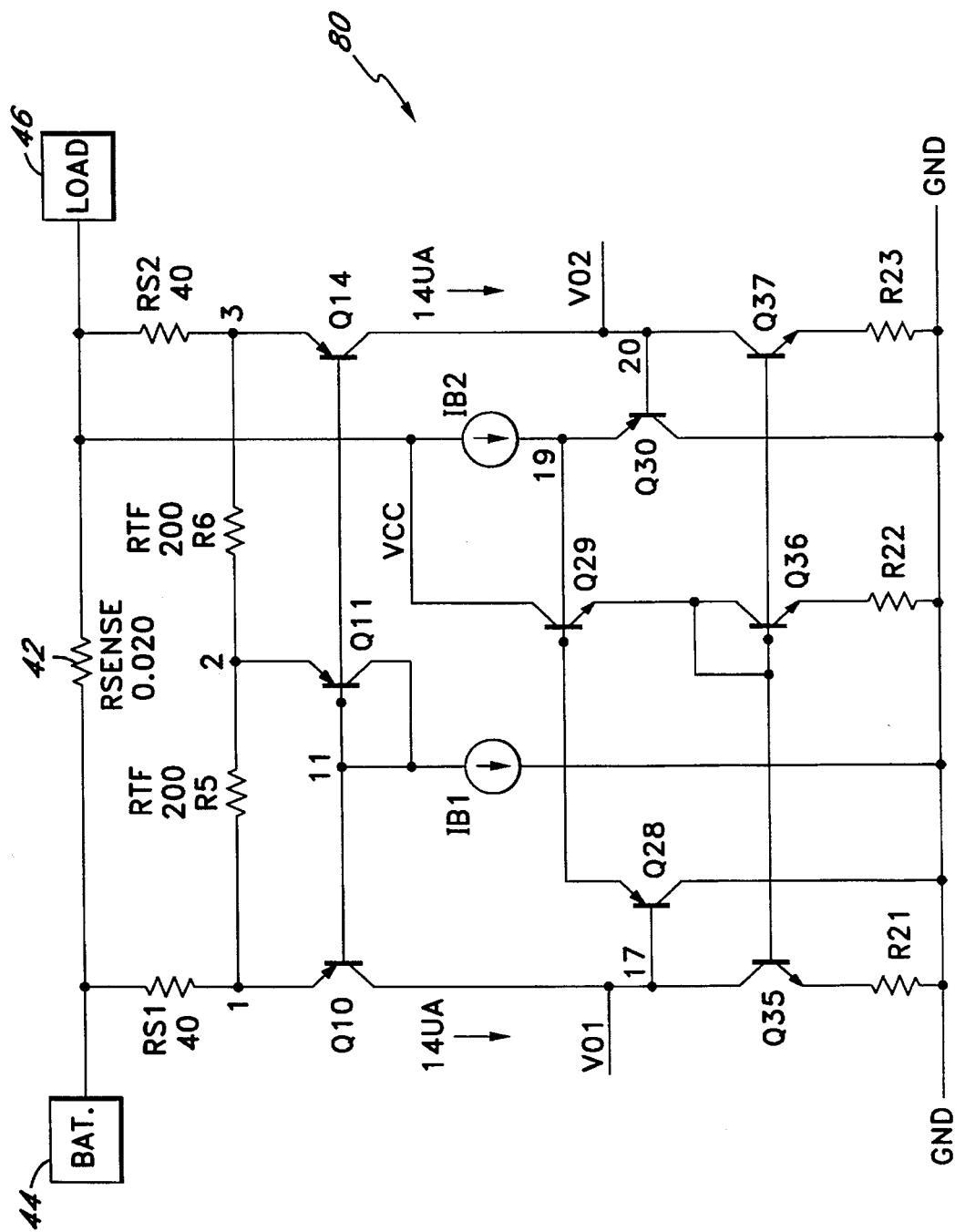
FIG. 6 depicts a detailed schematic diagram of the implementation of the operational amplifiers utilized in the symmetric bipolar current sense amplifier of FIG. 5.
Figure 7A:
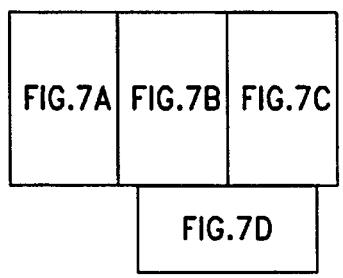
FIG. 7 is a detailed schematic diagram of the symmetric bipolar current sense amplifier of FIG. 5.
Figure 7A:
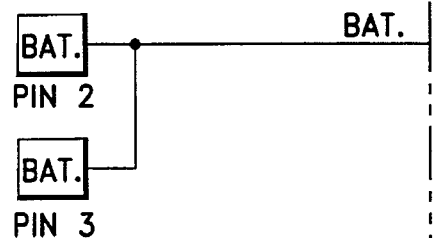
Figure 7A:
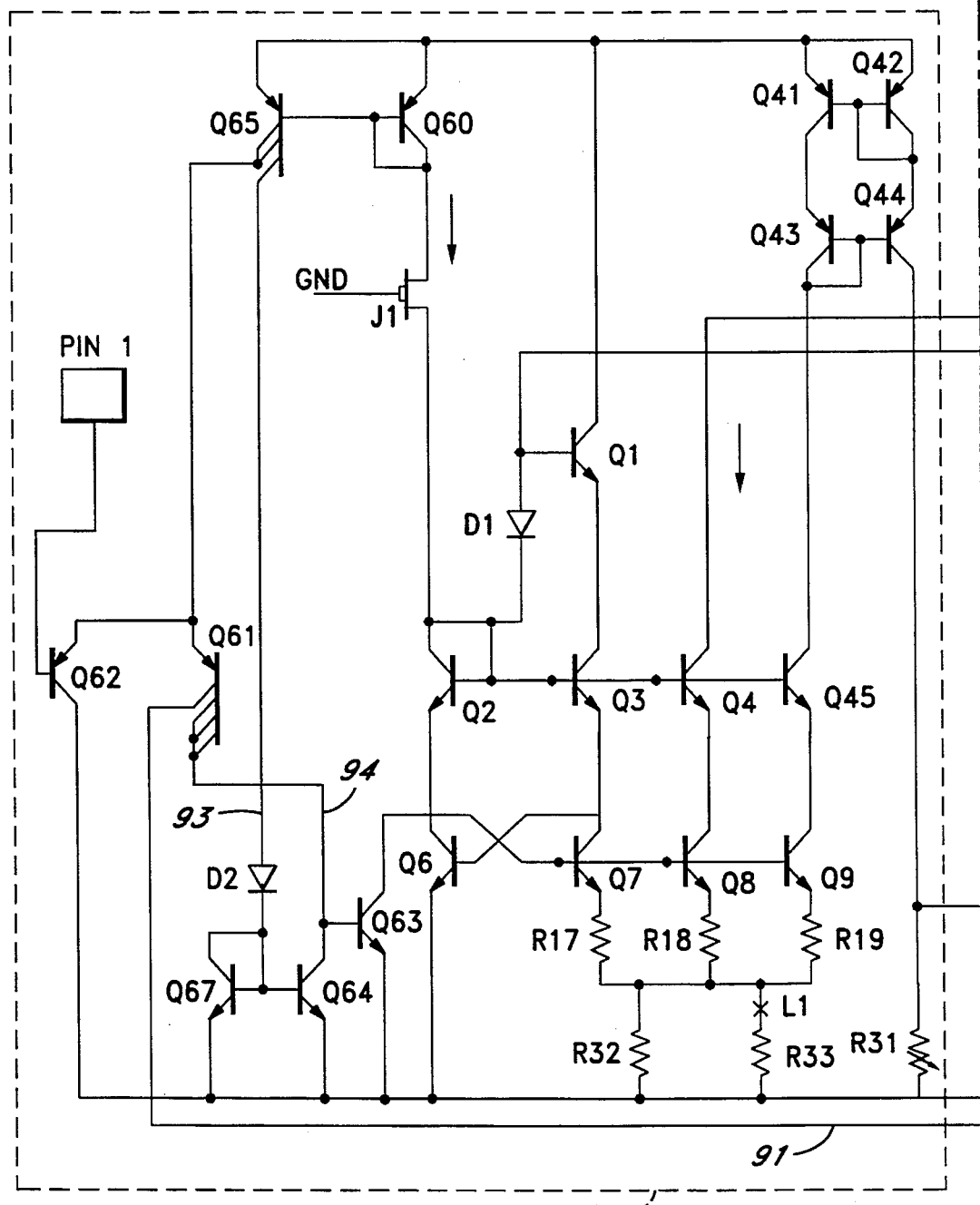
Figure 7B:
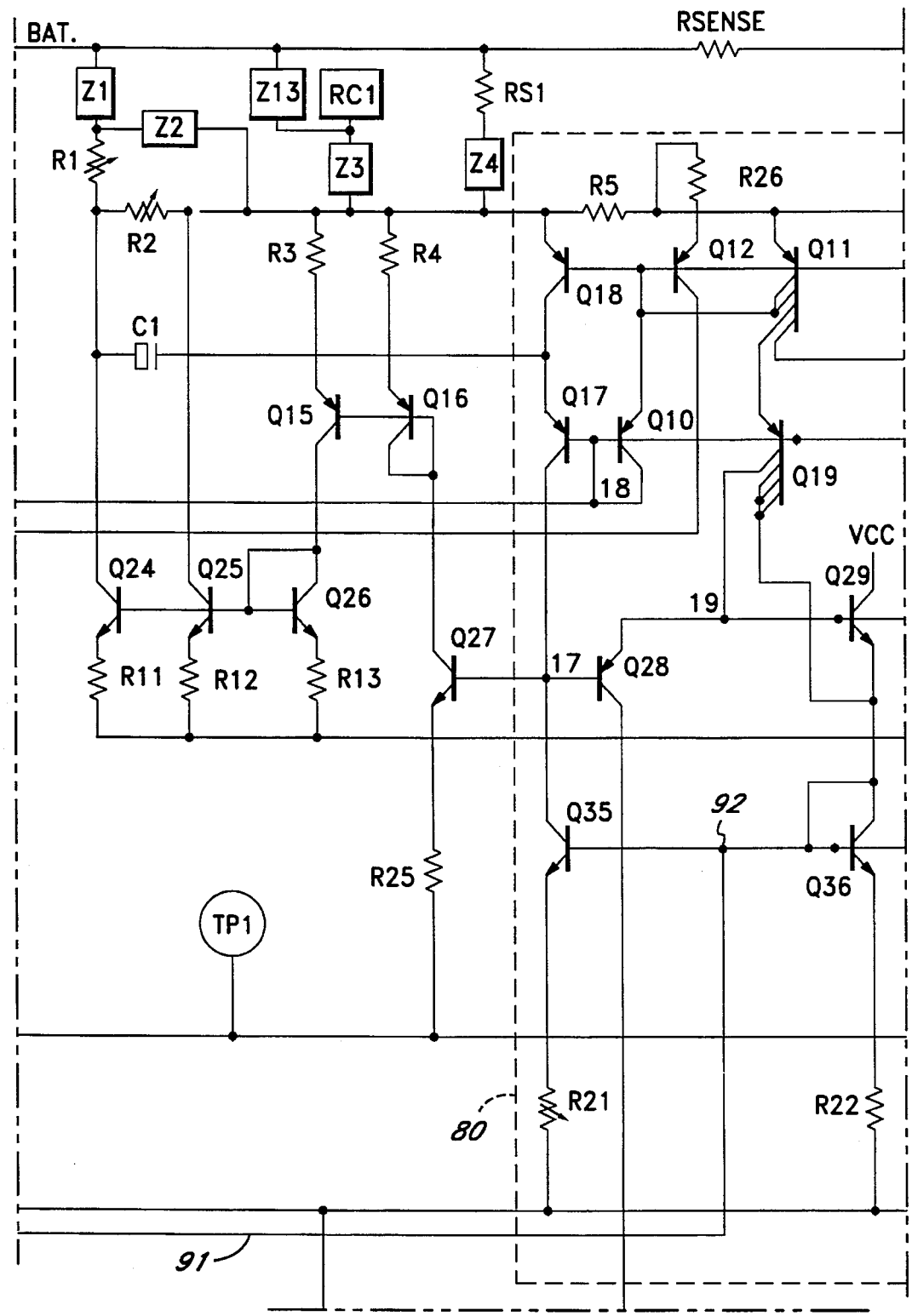
Figure 7C:
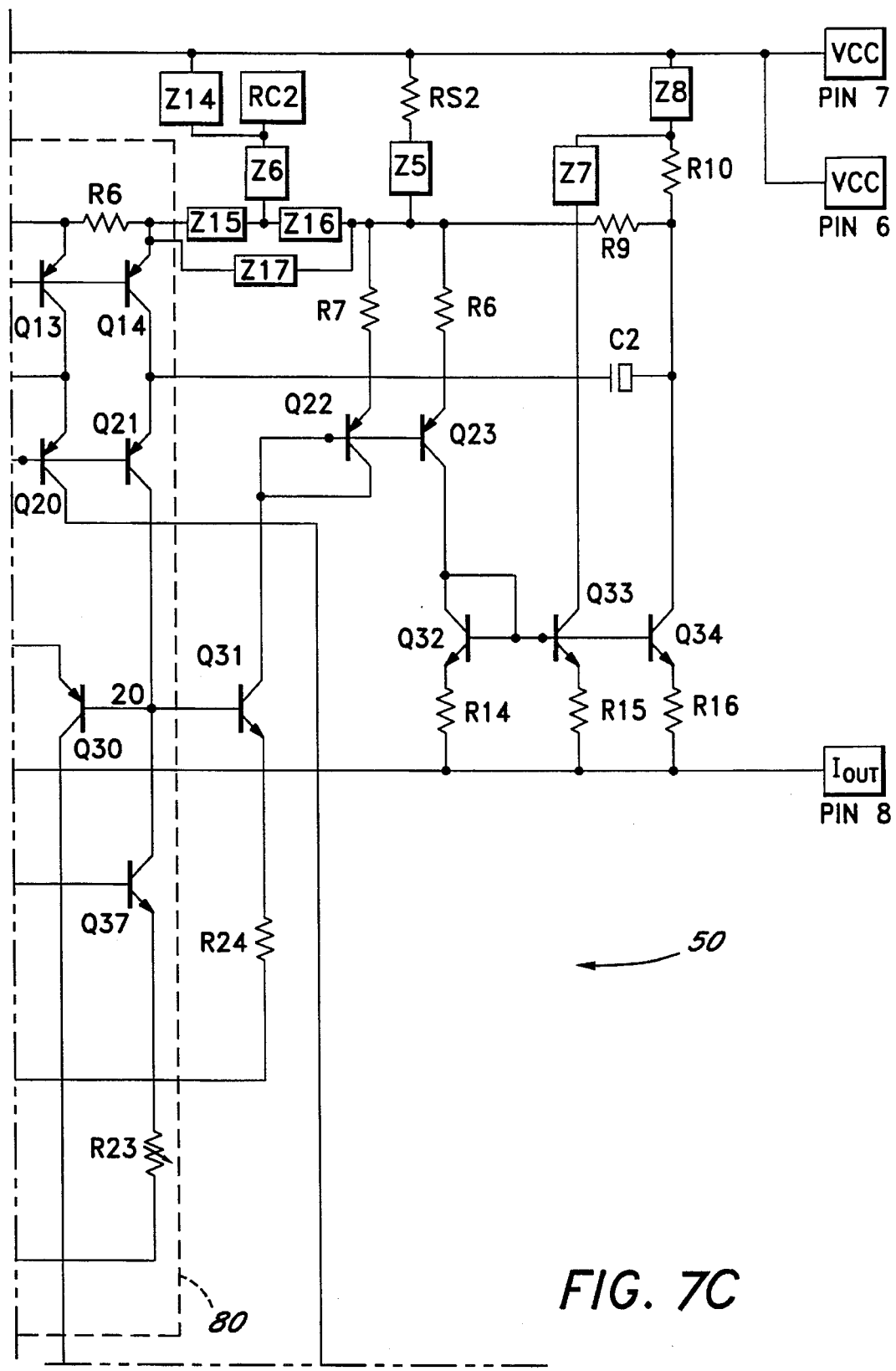
Figure 7D:
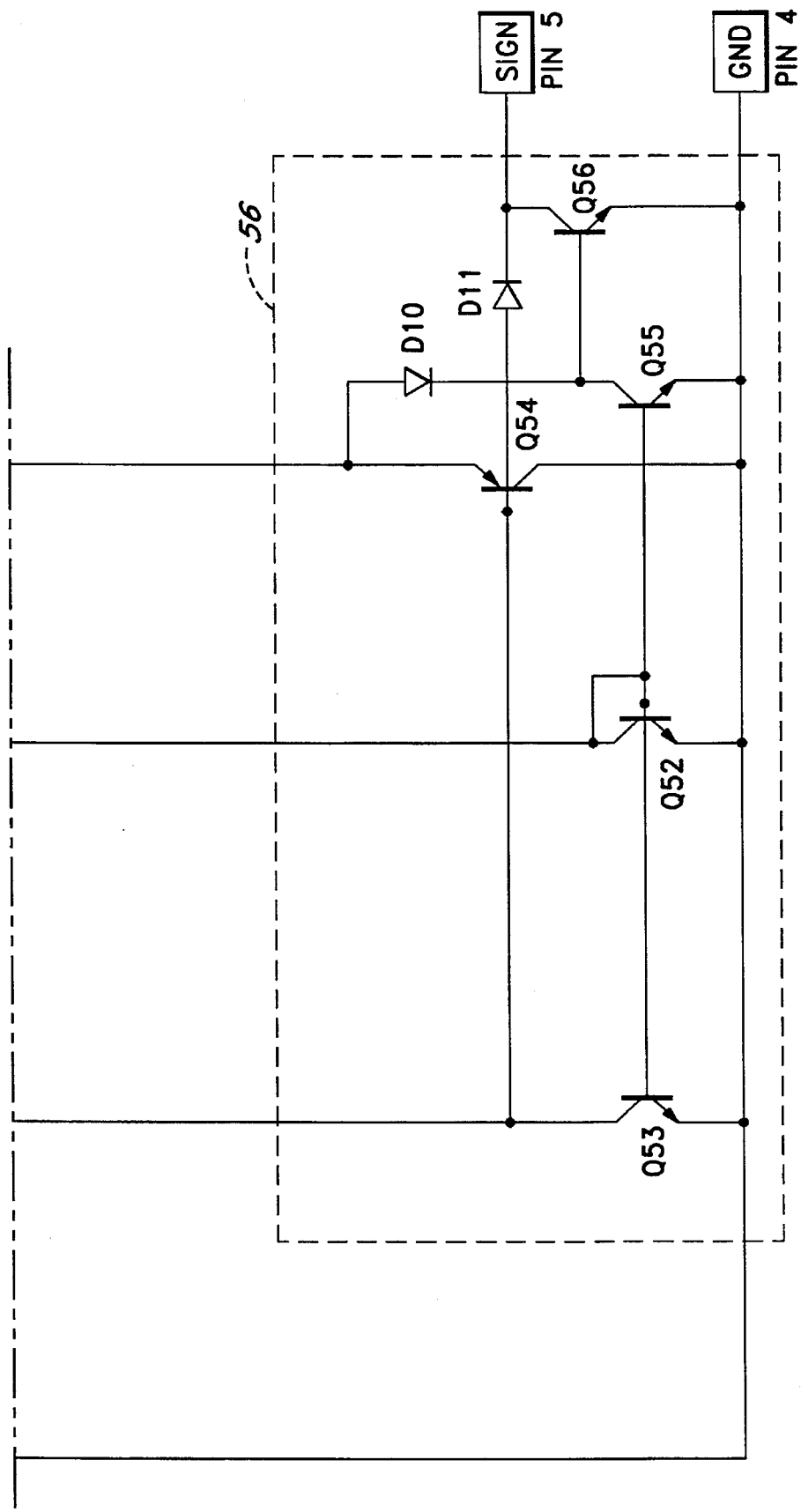

FIG. 6 depicts a detailed schematic diagram of the implementation of the symmetric amplifier utilized in the symmetric bipolar current sense amplifier of FIG. 5. For purposes of illustration, resistor values and current source values are set forth in the figure and used in the following discussion. For discussion purposes, the current $I_{LOAD}$ flowing from battery 44, through $R_{SENSE}$ 42 to load 46 is considered to have a positive polarity. As such, $R_{SENSE}$ 42 is considered to have its positive terminal 52 connected to battery 44 and its negative terminal 54 connected to load 46. The battery 44 and load 46 are both grounded. The symmetric amplifier 80 of the disclosed embodiment comprises seven resistors RS1, RS2, R5, R6, R21, R22, R23, five pnp transistors Q10, Q11, Q14, Q28, Q30, four npn transistors Q29, Q35, Q36, Q37, and two current sources IB1, IB2. Being symmetric in design, RS1, R5, Q10, Q28, Q35, and R21 correspond to RS2, R6, Q14, Q30, Q37 and R23, respectively, with $R_{SENSE}$ 42, Q11, Q29, Q36 and R22, and the two current sources IB1 and IB2 being the common elements between the two halves of the symmetric amplifier 80. RS1, R5, R6 and RS2 are coupled in series with each other and in parallel with $R_{SENSE}$ 42, with one end of resistor series RS1, R5, R6 and RS2 being coupled to the positive terminal 52 of $R_{SENSE}$ 42 and the other end of the resistor series RS1, R5, R6 and RS2 being coupled to the negative terminal 54 of $R_{SENSE}$ 42. Node 1 is located between RS1 and R5, and serves as one input to the amplifier 80. Node 2 is located between R5 and R6, while node 3, which serves as the second input to the amplifier 80, is located between RS2 and R6. The emitters of transistors Q10, Q11 and Q14 are coupled to nodes 1, 2 and 3 respectively. Since R5 and R6 are low valued resistors, Q10 and Q14 act as current mirrors having a current therethrough proportional to the current through Q11. The collector of Q11 is connected to its base. The collectors of Q10 and Q14 are connected to the collectors of Q35 and Q37 respectively.

Nodes 17 and 20, which serve as outputs of amplifier 80, are located between Q10 and Q35, and between Q14 and Q37 respectively. The potentials measured at nodes 17 and 20 are V01 and V02, respectively. The emitters of Q35 and Q37 are connected to resistors R21 and R23 respectively, which are in turn connected to ground. Current source IB1 is connected at one end to the collector of Q11 and at the other end to ground. Current source IB2 is connected at one end to Vcc and at the other end to the emitters of Q28 and Q30. IB1 biases Q10 and Q14, while IB2 biases Q28 and Q30. The collector of Q29 is connected to the load 46 which has a potential of VCC and its emitter is connected to the collector of transistor Q36. The base of transistor Q29 is connected to the emitter of Q28 and to node 19, which is located between current source IB2 and Q30. The bases of Q28 and Q30 are connected to nodes 17 and 20 respectively while the collectors of Q28 and Q30 are connected to ground. The emitter of Q29 is connected to Q36, while the emitter of Q36 is connected to ground via resistor R22. The collector of Q36 is connected to its base. The resistors R21, R23 and R22 are chosen in inverse proportion to the areas of transistors Q35, Q37 and Q36, respectively, so that each of the devices Q35, Q37 act as current mirrors having a current therethrough proportional to the current of Q36.

When the current sense amplifier 50 is not coupled to load 46, the load current flowing through $R_{SENSE}$ 42 is zero. However, current from current source IB2 flows through $R_{SENSE}$ 42, but this current is very small so that the voltage drop across $R_{SENSE}$ 42 is less than a microvolt. Current source IB1 forward biases Q11, and emitter current from Q11 flows equally through R5 and R6. The current flowing through the resistors R5, R6 sets up a voltage differential across each resistor R5 and R6. However, this voltage differential is sufficiently small (0.35 mV) that Q10 and Q14 experience about the same base-emitter voltage as Q11. Since Q10 and Q14 have four times the area of Q11, they each operate at four times the current of Q11 (about 14 microamps). Thus, the current flowing through each resistor RS1 and RS2 is (14+(3.5/2) microamps=15.75 microamps, resulting in an equal voltage differential of 0.63 mV across each resistor RS1, RS2. As a result, nodes 1 and 3 are at the same potential. Q10 and Q14 provide current into nodes 17 and 20, pulling nodes 17 and 20 positive. The emitters of Q28 and Q30 follow one VBE above, being pulled up by IB2, which causes the base of Q29 to also be pulled up. Q29 is connected as an emitter follower, and turns on Q36, which is mirrored to Q35 and Q37. (The current mirrors use resistors in the emitter circuits rather than mere transistor area ratios, as the voltage drop across R21 or R23, which ever is conducting, forms a substantial part of the output voltage V01 or V02, respectively.) These two transistors turn on until their currents balance those of Q10 and Q14, at which time conduction through Q28 and Q30 limits the voltage of node 19 to limit the voltage of node 32 one VBE therebelow to control the current being mirrored to the balance value. The steady state condition is:

$$V01 = VBE_{Q35} + 14 \times 10^{-6} * R21 + VBE_{Q29} - VBE_{Q28}$$

$$V02 = VBE_{Q37} + 14 \times 10^{-6} * R23 + VBE_{Q29} - VBE_{Q30}$$

For matched devices, V01 will equal V02 (no load current).

If current is flowing from the battery to the load through $R_{SENSE}$ 42, then there is a voltage drop across $R_{SENSE}$ 42. In this case, nodes 1 and 3 are not at the same voltage. Specifically, node 1 will now be more positive than node 3. Node 2 will also be more positive than node 3 since it is midway between nodes 1 and 3. Q10 will conduct more current than before, and Q14 will conduct less. This causes node 17 to rise in voltage and node 20 to fall. Q28 shuts off while Q29, Q30, Q36 and Q37 seek a balance point such that the collector current of Q37 equals the collector current of Q14, now below 14 microamps. At equilibrium:

$$V02 = VBE_{Q37+IQ37} * R23 + VBE_{Q29-VBEQ30}$$

Since the amplifier circuit 80 is symmetric, only one output node, i.e., either node 17 or 20, swings positive at a time, provided the input signal is non zero. As such, transistors Q28 and Q30 act as OR'ing diodes in this circuit.

On the other hand, node 17 (VO1) is now a high impedance point since Q28 is shut off. This makes this side of the amplifier a high gain stage and transistor Q1 is turned on. The amplifier circuit 80 reaches equilibrium when the collector current in transistor Q1, which flows through resistor RS1, creates a voltage drop across resistor RS1 equal to that across $R_{SENSE}$ 42. This occurs when the collector current in transistor Q1 equals $I_{LOAD} * R_{SENSE}/RS1$. Where $R_{SENSE}=$ 0.020 ohms and RS1=40 ohms, the collector current in transistor Q1 equals $I_{LOAD}/2000$ amps. Most of the collector current in Q1 flows through to its emitter and out the $IOU_T$ terminal 62, whereby $I_{OUT}=I_{LOAD}/2000$.

If the polarity of $I_{LOAD}$ is reversed, that is, if current flows from the load 46 to the battery 44 through $R_{SENSE}$ 42, Q30 would shut off, and the transistors Q28, Q29, Q35, and Q36 would seek an equilibrium. As discussed, the amplifier circuit 80 is symmetric, and only one output node, i.e., either node 17 or 20, swings positive at a time, provided the input signal is non zero. Thus, in this situation, node 20 swings positive and node 17 swings negative. In addition, the output of the comparator 56 swings negative (i.e., to ground).

FIG. 7 is a detailed schematic diagram of the symmetric bipolar current sense amplifier of FIG. 5. The reference numbers for the components and nodes are identical to those in FIG. 6 to facilitate the comparison of the two schematics. The symmetric amplifier circuit 80 of FIG. 6 is depicted within the dashed lines of FIG. 7.

In addition, the circuit in the schematic of FIG. 7 is basically the same as that depicted in FIG. 6, but adds a pnp cascade stage to each transistor Q10 and Q14 to increase voltage gain and improve power supply rejection. In addition, since Q28 and Q30 are already connected to nodes 17 and 20, they comprise a differential amplifier gain stage. This allows them to be used as the input stage of the comparator 56. Thus, the symmetric amplifier 80 in FIGS. 6 and 7 replaces the operational amplifiers 48, 49 in FIG. 5 and also provides part of the input stage for the comparator 56.

As illustrated in the schematic of FIG. 7, nodes 17 and 20 drive transistors Q27 and Q31, respectively. Q27 drives current mirror Q15 and Q16 which steps up the current ten times, and then drives current mirror Q24, Q25, and Q26. Here, the current is stepped up 24 times. Q24's current can be diverted through trim networks R1 or R2 to trim the gain ratio of 2000 to 1. When untrimmed, half of Q24's current goes through R2. Thus the current through RS1 is comprised mainly of half of Q24's collector current, Q26's collector current, and the emitter currents of Q15 and Q16. The output current, IOUT, is comprised of the emitter currents of Q24, Q25 and Q26. This gives a current ratio of RS1's current to $I_{OUT}$ of about 21.1/25=0.844. Ideally, RS1 should be 40 ohms, but only 84.4% of 1OUT is flowing through RS1. Consequently, RS1 must be made larger by 40.4/0.844 to give the desired 2000 to 1 ratio. Trim resistors R1 and R2 allow for about a ±18% trim range.

The gain ratio is set primarily by the ratio of RS1 to $R_{SENSE}$, these resistors must match. But an added constraint requires $R_{SENSE}$ to handle high currents with little voltage drop. For this reason, $R_{SENSE}$ is made from aluminum metal on the integrated circuit. Since RS1 must match $R_{SENSE}$, it too is preferably made from aluminum. The current sense amplifier 80 is symmetric, so RS2 and the circuitry associated with it are identical to the RS1 side.

As shown in FIG. 7, the comparator 56 comprises four npn transistors Q52, Q53, Q55 and Q56, a pnp transistor Q54 and two diodes D11 and D18. The collectors of Q28 and Q30 are connected to the collectors of Q53 and Q52 respectively. The base of Q52 is connected to the base of Q53 and Q55. The collector of Q53 is connected to the base of Q54 and to the SIGN terminal via diode D11. Q53 and Q55 act as current mirrors to the current through Q52. The base of Q56 is connected to the collector of Q55.

As discussed earlier, when current flows from battery 44 to load 46 through $R_{SENSE}$ 42, Q28 is shut off and node 17 becomes a high impedance point. At the same time, Q30 is turned on and node 20 becomes a low impedance point. When this occurs, Q52 is turned on, and the current through Q52 is mirrored through Q53 and Q55, which are accordingly turned on. Q54 is also turned on, while Q55 turns Q56 off. This allows an external resistor to pull Pin 6 high, which indicates that the polarity of $I_{LOAD}$ is positive.

When the polarity of $I_{LOAD}$ is reversed, as in battery charging Q30 shuts off and Q28 is turned on. With Q30 turned off, no current passes through Q52. Q53 and Q55 are accordingly turned off. With Q28 being turned on, Q54 is turned off, and D18 is forward biased to turn Q56 on, holding the SIGN terminal low, which indicates that the polarity of $I_{LOAD}$ is negative.

In one embodiment, a shutdown circuit 90 is coupled to the amplifier 80 to shut down the current sense amplifier. This minimizes current drain from the battery. Shutdown circuit 90 provides a signal via line 91 to node 92 to reduce the potential of nodes 17 and 20, and to shut off Q27 and Q31.

In a preferred embodiment, shutdown circuit 90 operates as follows. When PIN 1 is asserted high, transistor Q62 is turned off, which in turn activates Q61. However, the current flow through line 94 is greater than that through line 93, turning on Q63, which in turn provides a short to the transistor cascade Q7, Q8, Q9, effectively cutting off the current sources IB1 and IB2 (see FIG. 6). When Q61 is turned on, line 91 is asserted high, which turns on Q35, Q36 and Q37. This in turn pulls nodes 17 and 20 down, shutting off Q27 and Q31, thereby preventing amplification of any leakage current while in the shutdown mode.

Conversely, when PIN 1 is low, Q62 is turned on and Q61 is turned off, so that Q67 and Q64 are both turned on, and Q63 is turned off. This turns on the current sources IB1 and IB2, thereby providing bias current for the amplifier circuit 80.

The schematic diagram of FIG. 7 also depicts a preferred embodiment of the present invention whereby either an internal sense resistor or an external sense resistor may be implemented with minor mask-determined alterations to the circuit. If the use of an internal sense resistor is selected, connectors ZMO represent short circuits, while connectors YMO represent open circuits. In this configuration, current from the battery to the load will pass through $R_{SENSE}$, the internal sense resistor. If the use of an external sense resistor is instead required, the connectors YMO will represent short circuits, while the connectors ZMO will represent open circuits. In this configuration, the amplifier circuit will be connected to terminals RG1 and RG2, which may be connected to external sense resistors (not shown).

A current sense amplifier utilizing an internal sense resistor performs optimally within certain range limitations. The maximum amount of current that may be drawn through the internal sense resistor is limited by the current capabilities of the aluminum metal, bond wire current limitations, and power dissipation of the integrated circuit. Performance is also limited by the amplifier's offset voltage, noise, and power supply rejection. These errors amount to 100 microvolts. For a 0.02 ohm sense resistor, a 5 mA load current would correspond to a 100 microvolt signal. Thus, a design with a 0.02 ohm current sense resistor is limited to a useful range of about 30 mA to 3 A. For applications at current ranges beyond this range, external resistors may be used. This requires the matching of three resistors, namely, $R_{SENSE}$, RS1 and RS2. In addition, when external resistors are used, there is no gain trimming and the collectors of Q24 and Q25 are tied together, as are the collectors of Q33 and Q34. Over 99% of $I_{OUT}$ will flow through the external RS1 and RS2 resistors (as opposed to 84.4% when internal resistors are used).

The present invention has several advantages over conventional current sense amplifiers. The invention has an internal sense resistor which is used to detect the current flowing from the battery to the load (ILOAD). The circuit outputs a current proportional to the absolute value of $I_{LOAD}$. In one particular implementation, this is set to $I_{OUT}=I_{LOAD}/2000$. A separate output line, SIGN, indicates the polarity of the current. The invention has the following advantages over existing approaches:

1. The circuit is self contained. It has its own current sense resistor as well as a precision current divider circuit, which gives a precise output current proportional to the load current.

2. It does not require careful matching of four gain resistors, as required by conventional high side current sense amplifiers.

3. The output current can easily be converted to an output voltage by adding an external resistor from $I_{OUT}$ to ground. This resistor does NOT need to be matched to any other resistor. Also, the output voltage range is easily set by selecting this resistor's value. This makes a good general purpose part since the user can tailor the output voltage to the measurement system. The measurement system doesn't have to live with a prescribed output voltage range.

4. No voltage reference is needed to accommodate an offset output signal. A bipolar signal is indicated by a sign/magnitude technique. The magnitude part of the signal is easily referenced to ground. The SIGN line is a logic output signal referenced to ground. It is an open collector logic line which allows the line to swing over a voltage range that may be greater or smaller than the battery voltage. This gives maximum flexibility for a general purpose part.

The present invention may be used as a general purpose current sense amplifier integrated circuit. In one embodiment, the current sense amplifier of the present invention utilizes an internal sense resistor operating at a fixed current gain of 1/2000. In an alternate embodiment, the present embodiment utilizes external sense and gain resistors which allow an arbitrary current gain ratio to be set.

The present invention is particularly useful for monitoring battery supply current in portable equipment. The embodiment utilizing an internal current sense resistor is also particularly applicable to the portable laptop computer market. However, the present invention may also be adapted to monitor battery current flow in other consumer products, such as camcorders.

Thus, while the present invention has been disclosed and described with respect to a certain preferred embodiments thereof, it will be understood to those skilled in the art that the present invention may be varied without departing from the spirit and scope of the invention. The described embodiments are to be considered in all respects to be illustrative and not restrictive. The scope of the invention is, therefore, indicated by the appended claims rather than the foregoing description. All changes which come within the meaning and range of equivalency are to be embraced within their scope.

What is claimed is:

1. A bidirectional current sense amplifier comprising: first and second terminals for connection to a current sense resistor to sense the magnitude and polarity of the potential difference between the first and second terminals;

a first circuit coupled to the first and second terminals for providing an output on a first output terminal, responsive to the magnitude of the potential difference between the first and second terminals; and a second circuit for providing a two-state signal on a second output terminal responsive to the polarity of the potential difference between the first and second terminals.

2. The amplifier of claim 1 wherein the output on the first output terminal is a current.

3. The amplifier of claim 1 wherein the two-state signal on the second output terminal is a signal characterized by a signal connected to a circuit ground through a transistor which is biased on, and a high impedance.

4. The amplifier of claim 1 comprising a single integrated circuit, and further comprising an on-chip sense resistor coupled between the first and second terminals.

5. The amplifier of claim 1 wherein the second circuit is a comparator.

6. The amplifier of claim 1 wherein the first circuit is connected to the first and second terminals via first and second input resistors, respectively.

7. The amplifier of claim 6 wherein the sense resistor and the first and second resistors are aluminum.

8. The amplifier of claim 1 wherein the first circuit comprises a symmetric amplifier circuit for sensing the magnitude of the potential difference.

9. The amplifier of claim 8 wherein the symmetric amplifier circuit includes first and second amplifier outputs, the first and second amplifier outputs being active and inactive, respectively, when the potential difference has a first polarity, and the first and second amplifier outputs being inactive and active, respectively, when the potential difference has a second polarity.

10. The amplifier of claim 9 wherein the first amplifier output includes a first feedback path coupled to the first terminal and the second amplifier output includes a second feedback path coupled to the second terminal.

11. The amplifier of claim 10 wherein the first and second feedback paths comprise first and second output transistors respectively, each transistor having an emitter, a base and a collector, the first output transistor having its emitter coupled to the first output terminal, its base coupled to the first amplifier output, and its collector coupled to the first input resistor, and the second output transistor having its emitter coupled to the first output terminal, its base coupled to the second amplifier output and its collector coupled to the second input resistor.

12. The amplifier of claim 11 wherein the second circuit is responsive to the output of the first circuit.

13. The amplifier of claim 12 wherein the symmetric amplifier circuit comprises:

first, second and third transistors of a first conductivity type, each having an emitter, a base and a collector, the second transistor having its base coupled to its collector and the base of the first and third transistors, the first transistor having its emitter coupled to the first input resistor, the second transistor having its emitter coupled to the second input resistor;

a first current source being coupled to the collector of the second transistor at one end;

first and second impedances, the first impedance being coupled to the first transistor's emitter at one end and the emitter of the second transistor at the other end, the second impedance being coupled to the third transistor's emitter at one end and the emitter of the second transistor at the other end;

fourth, fifth and sixth transistors of a second conductivity type, having an emitter, a base and a collector, the fifth transistor having its collector coupled to its base, its base connected to the base of the fourth and sixth transistors, its emitter coupled to ground, the fourth transistor having its collector connected to the collector of the first transistor and its emitter connected to ground, the sixth transistor having its collector connected to the collector of the third transistor its emitter connected to ground;

a second current source connected to the second terminal;

seventh transistor of a second conductivity type, having an emitter, a base and a collector, the seventh transistor having its collector connected to the second terminal, and its emitter connected to the collector of the fifth transistor; and eighth and ninth transistors of a first conductivity type, each having an emitter, a base and a collector, the eight transistor having its emitter connected to the base of the seventh transistor, its base connected to the collector of the fourth transistor, and its collector connected to ground, the ninth transistor having its emitter connected to the second current source and the base of the seventh transistor, its base connected to the collector of the sixth transistor and its collector connected to ground of the second circuit.

14. The amplifier of claim 12 wherein the first, second, third, eighth and ninth transistors are pnp transistors and wherein the fourth, fifth, sixth and seventh transistors are npn transistors.

15. The amplifier of claim 1, further comprising a shutdown circuit for turning off said first circuit.

16. The amplifier of claim 15 wherein said shut down circuit is responsive to a high voltage state to shut down said first circuit.

17. A bidirectional current sensing integrated circuit comprising:

first and second terminals for connection to a current sense resistor to sense the magnitude and polarity of the potential difference between the first and second terminals;

an amplifier for providing an output responsive to a potential difference between the first and second terminals of a first polarity;

an amplifier for providing an output responsive to a potential difference between the first and second terminals of a second polarity;

OR'ing circuitry for OR'ing the outputs of the amplifiers and providing a first output responsive thereto; and, comparing circuitry for comparing the outputs of the amplifiers and providing a second output responsive thereto.

18. The integrated circuit of claim 17 wherein the first output is proportional to the magnitude of the potential difference between the first and second terminals.

19. The integrated circuit of claim 18 wherein the first output is a current.

20. The integrated circuit of claim 19 wherein the amplifiers are differential amplifiers with current feedback, the current feedback providing the first output.

21. A bidirectional current sensing integrated circuit comprising:

a resistor connected to first and second terminals for connection in a circuit for current to flow therethrough;

an amplifier for providing an output responsive to a potential difference across the resistor of a first polarity;

an amplifier for providing an output responsive to a potential difference across the resistor of a second polarity;

OR'ing circuitry for OR'ing the outputs of the amplifiers and providing a first output responsive thereto; and, comparing circuitry for comparing the outputs of the amplifiers and providing a second output responsive thereto.

22. The integrated circuit of claim 21 wherein the first output is proportional to the magnitude of the potential difference between the first and second terminals.

23. The integrated circuit of claim 22 wherein the first output is a current.

24. The integrated circuit of claim 23 wherein the amplifiers are differential amplifiers with current feedback, the current feedback providing the first output.

25. The integrated circuit of claim 24 wherein the resistor is a metal resistor.

26. A method for sensing the magnitude and polarity of current flowing through a sense resistor, comprising the steps of:

sensing a voltage difference across the sense resistor;

determining the magnitude of the current based on the voltage difference;

determining the polarity of the current based on the voltage difference;

providing a first output indicative of the magnitude of the current; and providing a second output indicative of the polarity of the current.

27. The method of claim 26 wherein the first output is a current.

28. The method of claim 26 wherein the first output is proportional to the current flowing through the sense resistor.

29. The method of claim 26 wherein the step of determining the magnitude of the current further comprises the step of providing first and second signals, the first and second signals being active and inactive respectively when the voltage difference has a first positive polarity, and the first and second outputs being inactive and active respectively when the voltage difference has a second negative polarity.

* * * * *

UNITED STATES PATENT AND TRADEMARK OFFICE
CERTIFICATE OF CORRECTION

PATENT NO. : 5,498,984
DATED : March 12, 1996
INVENTOR(S) : Gregory L. Schaffer

It is certified that errors appear in the above-identified patent and that said Letters Patent is hereby corrected as shown below:

In column 3 at line 6, please delete " $(I\, I_{LOAD} = /$ " and insert -- $(I\, I_{LOAD}\, I /$ --.

In column 3 at line 8, please delete " $(= I_{OUT} = / I_{LOAD})$ " and insert -- $(I\, I_{OUT}\, I / I_{LOAD})$ In column 6 at line 20, please delete " $IOU_T$ " and insert -- $I_{OUT}$ --.

In column 8 at line 24, please delete " $= I_{LOAD} /$ " and insert -- $= |ILOAD|/$ Signed and Sealed this Twelfth Day of November, 1996

Attest:

BRUCE LEHMAN

Attesting Officer

Commissioner of Patents and Trademarks